(12) United States Patent
Kim et al.

(10) Patent No.: US 11,069,726 B2
(45) Date of Patent: Jul. 20, 2021

(54) METHOD OF MANUFACTURING DISPLAY DEVICE

(71) Applicant: Samsung Display Co., Ltd., Yongin-si (KR)

(72) Inventors: Hyun Joon Kim, Yongin-si (KR); Kyung Bae Kim, Yongin-si (KR); Kyung Hoon Chung, Yongin-si (KR); Mee Hye Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/262,715

(22) Filed: Jan. 30, 2019

(65) Prior Publication Data
US 2019/0244985 A1    Aug. 8, 2019

(30) Foreign Application Priority Data
Feb. 6, 2018   (KR) ........................ 10-2018-0014656

(51) Int. Cl.
*H01L 33/62* (2010.01)
*H01L 27/15* (2006.01)
(Continued)

(52) U.S. Cl.
CPC ...... *H01L 27/1296* (2013.01); *H01L 25/0753* (2013.01); *H01L 25/167* (2013.01);
(Continued)

(58) Field of Classification Search
CPC ..... H01L 33/0075; H01L 33/20; H01L 33/06; H01L 33/08; H01L 33/24; H01L 33/387;
(Continued)

(56) References Cited

U.S. PATENT DOCUMENTS

| 8,349,116 B1 | 1/2013 | Bibl et al. |
| 8,791,474 B1 | 7/2014 | Bibl et al. |

(Continued)

FOREIGN PATENT DOCUMENTS

| KR | 10-1596382 B1 | 2/2016 |
| KR | 10-1596386 B1 | 2/2016 |

(Continued)

*Primary Examiner* — Brian Turner
(74) *Attorney, Agent, or Firm* — Lewis Roca Rothgerber Christie LLP

(57) ABSTRACT

A method of manufacturing a display device, the method including providing a substrate, forming a first electrode, a second electrode spaced from the first electrode and in a same plane as the first electrode, a first alignment line connected to the first electrode, and a second alignment line connected to the second electrode on the substrate, self-aligning the plurality of light emitting elements by providing a solution containing a plurality of light emitting elements on the substrate, removing the first alignment line and the second alignment line from the substrate on which the plurality of light emitting elements are self-aligned, forming a first contact electrode electrically connecting one end of each light emitting element to the first electrode, and forming a second contact electrode electrically connecting an other end of each light emitting element to the second electrode.

19 Claims, 10 Drawing Sheets

(51) Int. Cl.
  *H01L 33/36* (2010.01)
  *H01L 25/075* (2006.01)
  *H01L 33/18* (2010.01)
  *H01L 27/12* (2006.01)
  *H01L 33/38* (2010.01)
  *H01L 25/16* (2006.01)
  *H01L 33/00* (2010.01)
  *H01L 33/20* (2010.01)

(52) U.S. Cl.
  CPC .......... *H01L 27/124* (2013.01); *H01L 33/387* (2013.01); *H01L 33/0095* (2013.01); *H01L 33/20* (2013.01); *H01L 33/62* (2013.01); *H01L 2933/0016* (2013.01)

(58) Field of Classification Search
  CPC ................ H01L 25/0753; H01L 33/32; H01L 2933/0066; H01L 2933/0016; H01L 33/16
  See application file for complete search history.

(56) References Cited

U.S. PATENT DOCUMENTS

| | | | |
|---|---|---|---|
| 8,809,875 B2 | 8/2014 | Bibl et al. | |
| 8,941,215 B2 | 1/2015 | Hu et al. | |
| 9,035,279 B2 | 5/2015 | Hu et al. | |
| 2006/0171135 A1* | 8/2006 | Ishizaka | H05B 45/37 362/11 |
| 2013/0099204 A1* | 4/2013 | Avouris | B82Y 10/00 257/24 |
| 2013/0168708 A1* | 7/2013 | Shibata | H01L 24/75 257/88 |
| 2017/0012112 A1* | 1/2017 | Kim | H01L 27/1288 |
| 2017/0141279 A1* | 5/2017 | Do | B23K 26/00 |
| 2017/0309798 A1 | 10/2017 | Bonar et al. | |
| 2017/0317228 A1* | 11/2017 | Sung | H01L 33/0075 |
| 2018/0357522 A1* | 12/2018 | Roach | G06K 7/10564 |
| 2019/0088724 A1* | 3/2019 | Do | H01L 33/38 |

FOREIGN PATENT DOCUMENTS

| | | |
|---|---|---|
| KR | 10-1630138 B1 | 6/2016 |
| KR | 10-1704152 B1 | 2/2017 |
| KR | 10-1737281 B1 | 5/2017 |
| KR | 10-2017-0084139 A | 7/2017 |
| KR | 10-2017-0094930 A | 8/2017 |
| KR | 10-1820275 B1 | 1/2018 |
| WO | WO 2013/074376 A1 | 5/2013 |

\* cited by examiner

METHOD OF MANUFACTURING DISPLAY DEVICE

CROSS-REFERENCE TO RELATED APPLICATION

The application claims priority to and the benefit of Korean Patent Application No. 10-2018-0014656, filed Feb. 6, 2018, the disclosure of which is hereby incorporated by reference in its entirety.

BACKGROUND

1. Field

Aspects of the present invention relate to a method of manufacturing a display device.

2. Discussion

Light emitting diodes (LEDs) exhibit relatively good durability even under adverse environmental conditions, and have excellent performance in terms of lifetime and luminance.

In recent years, researches for applying such LEDs to various display devices have been actively conducted.

As a result, a technique for manufacturing ultra-small rod-like LEDs, such as on a microscale or nanoscale, using an inorganic crystal structure (e.g., a structure where a nitride-based semiconductor is grown) is being developed. For example, the rod-like LEDs may be manufactured to a small enough size to constitute a pixel or the like of a self-emission display device.

The above information disclosed in this Background section is for enhancement of understanding of the background of the invention and therefore it may contain information that does not form prior art.

SUMMARY

Aspects of embodiments are directed to a method of manufacturing a display device including rod-like LEDs.

According to some exemplary embodiments, there is provided a method of manufacturing a display device, the method including: providing a substrate; forming a first electrode, a second electrode spaced from the first electrode and in a same plane as the first electrode, a first alignment line connected to the first electrode, and a second alignment line connected to the second electrode on the substrate; self-aligning the plurality of light emitting elements by providing a solution containing a plurality of light emitting elements on the substrate having thereon the first and second electrodes and the first and second alignment lines, and supplying voltages to the first alignment line and the second alignment line; removing the first alignment line and the second alignment line from the substrate on which the plurality of light emitting elements are self-aligned; forming a first contact electrode electrically connecting one end of each light emitting element to the first electrode; and forming a second contact electrode electrically connecting an other end of each light emitting element to the second electrode.

In some embodiments, the removing of the first alignment line and the second alignment line is by an etching method.

In some embodiments, the substrate includes a display region on which a plurality of pixels are located and a non-display region on at least one side of the display region, and the first electrode and the second electrode are at the display region and the first alignment line and the second alignment line are at the non-display region.

In some embodiments, a first connection line connecting the first alignment line and the first electrode and a second connection line connecting the second alignment line and the second electrode are at the display region of the substrate.

In some embodiments, the first connection line is integrated with the first electrode, and the second connection line is integrated with the second electrode.

In some embodiments, the removing of the first alignment line and the second alignment line includes removing a part of the first connection line between adjacent two pixels.

In some embodiments, each of the light emitting elements includes: a first conductive semiconductor layer doped with a first conductive dopant, a second conductive semiconductor layer doped with a second conductive dopant; and an active layer between the first conductive semiconductor layer and the second conductive semiconductor layer.

In some embodiments, the first electrode includes an anode electrode, and the second electrode includes a cathode electrode.

In some embodiments, in the self-aligning of the light emitting elements, a voltage supplied to the first alignment line and a voltage supplied to the second alignment line are different.

In some embodiments, the voltage supplied to the first alignment line is a ground voltage.

In some embodiments, each of the light emitting elements includes a light emitting diode in the form of a cylindrical or polygonal column having a micro scale or a nano scale.

In some embodiments, the providing of the substrate includes: forming at least one transistor for driving the plurality of light emitting elements on the substrate; and forming a passivation layer on the transistor.

According to some exemplary embodiments, there is provided a method of manufacturing a display device, the method including: providing a substrate including a display region on which a plurality of pixels are provided and a non-display region on at least one side of the display region; forming at least one transistor on the substrate of the display region; forming a passivation layer on the substrate; forming a first electrode and a second electrode on the passivation layer corresponding to the display region, the second electrode being spaced from the first electrode and in a same plane as the first electrode; forming a first alignment line connected to the first electrode and a second alignment line connected to the second electrode on the passivation layer corresponding to the non-display region; self-aligning the plurality of light emitting elements by providing a solution containing a plurality of light emitting elements on the substrate having thereon the first and second electrodes and the first and second alignment lines, and supplying voltages to the first alignment line and the second alignment line; removing the first alignment line and the second alignment line from the substrate on which the plurality of light emitting elements are self-aligned using an etching method; forming a first contact electrode electrically connecting one end of each light emitting element and the first electrode; and forming a second contact electrode electrically connecting the other end of each light emitting element and the second electrode.

In some embodiments, the first electrode includes an anode electrode, and the second electrode includes a cathode electrode.

In some embodiments, in the self-aligning of the light emitting elements, a voltage supplied to the first alignment line and a voltage supplied to the second alignment line are different.

In some embodiments, the voltage supplied to the first alignment line is a ground voltage.

In some embodiments, the method further includes: forming a first connection line electrically connecting the first alignment line to the first electrode, and forming a second connection line electrically connecting the second alignment line to the second electrode, on the display region of the substrate.

In some embodiments, the first connection line is integrated with the first electrode, and the second connection line is integrated with the second electrode.

In some embodiments, the removing of the first alignment line and the second alignment line includes removing a part of the first connection line between adjacent two pixels.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION

Figure 1:
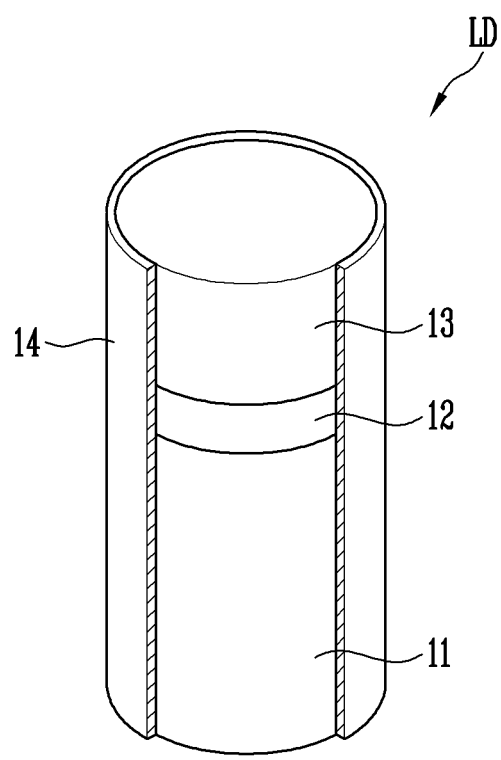
FIG. 1 is a perspective view illustrating a rod-like light emitting diode, according to an exemplary embodiment of the present invention.

Reference will now be made in detail to various embodiments of the present disclosure, specific examples of which are illustrated in the accompanying drawings and described below; however, embodiments of the present disclosure may be variously modified in many different forms, as suitable. As such, the foregoing is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration.

Hereinafter, exemplary embodiments of the present invention will be described in detail with reference to the accompanying drawings.

FIG. 1 is a perspective view illustrating a rod-like light emitting diode according to an exemplary embodiment of the present invention. In FIG. 1, a rod-like light emitting diode LD in the form of a cylindrical column is shown; however, the present invention is not limited thereto.

Referring to FIG. 1, the rod-like light emitting diode LD according to an exemplary embodiment of the present invention may include a first conductive semiconductor layer 11, a second conductive semiconductor layer 13, and an active layer 12 disposed between the first conductive semiconductor layer 11 and the second conductive semiconductor layer 13.

For example, the rod-like light emitting diode LD may be formed as a laminate in which the first conductive semiconductor layer 11, the active layer 12, and the second conductive semiconductor layer 13 are sequentially stacked. Hereinafter, the rod-like light emitting diode LD my also be referred to as a "rod-like LED LD".

According to an embodiment of the present invention, the rod-like LED LD may be provided in a rod shape (or a rod-like shape) extending along one direction. When the extension direction of the rod-like LED LD is a longitudinal direction, the rod-like LED LD may have one end and the other end along the extension direction. As an embodiment of the present invention, one of the first conductive semiconductor layer 11 and the second conductive semiconductor layer 13 may be disposed at the one end, and the other one of the first conductive semiconductor layer 11 and the second conductive semiconductor layer 13 may be disposed at the other end.

In FIG. 1, the rod-like LED LD may be provided in a cylindrical column shape; however, the present invention is not limited thereto. The term "rod-like" may refer to a rod or bar shape extending along the longitudinal direction and having an aspect ratio greater than 1 such as a cylindrical column, a polygonal column, or the like. For example, the length of the rod-like LED LD may be greater than the diameter thereof.

For example, the rod-like LED LD may be manufactured to a small size to have a diameter and/or length on a microscale or nanoscale. The size of the rod-like LED LD according to an embodiment of the present invention is not limited thereto and may be changed to meet the requirements of a display device to which the rod-like LED LD is applied.

The first conductive semiconductor layer 11 may include, for example, at least one n-type semiconductor layer. The first conductive semiconductor layer 11 may include one or more of the semiconductor materials of InAlGaN, GaN, AlGaN, InGaN, AlN, InN, and the like, and may be doped with a first conductive dopant such as Si, Ge, Sn, and/or the like.

Material of the first conductive semiconductor layer 11 is not limited thereto, and the first conductive semiconductor layer 11 may include various suitable materials that are not described herein.

The active layer 12 may be disposed on the first conductive semiconductor layer 11 and may have a single or multiple quantum well structure. The active layer 12 may include AlGaN, InAlGaN, and/or the like.

According to an embodiment of the present invention, a cladding layer doped with a conductive dopant may be disposed on the upper portion and/or the lower portion of the active layer 12. The cladding layer may include AlGaN, InAlGaN, and/or the like.

When a voltage exceeding a set or predetermined voltage is applied to both ends of the rod-like LED LD, electron-hole pairs are generated in the active layer 12, so that the rod-like LED LD emits light.

The second conductive semiconductor layer 13 may be provided on the active layer 12 and may include a semiconductor layer of a different type from the first conductive semiconductor layer 11. The second conductive semiconductor layer 13 may include at least one p-type semiconductor layer.

The second conductive semiconductor layer 13 may include at least one of the semiconductor materials of InAlGaN, GaN, AlGaN, InGaN, AlN, InN and may be doped with a second conductive dopant such as Mg, and/or the like. However, material of the second conductive semiconductor layer 13 is not limited thereto, and the second conductive semiconductor layer 13 may include various suitable materials that are not described herein.

The rod-like LED LD may include at least one of a phosphor layer, an active layer, a semiconductor layer, and an electrode layer disposed above and/or below each of the first conductive semiconductor layer 11, the active layer 12, and the second conductive semiconductor layer 13.

Also, the rod-like LED LD may further include an insulation layer 14. The insulation layer 14 may be provided on a portion of the first conductive semiconductor layer 11, the active layer 12, and the second conductive semiconductor layer 13. For example, the insulation layer 14 may be provided at a portion other than both ends of the rod-like LED LD (i.e., the insulation layer 14 may not be provided at the ends of the rod-like LED LD), so that both ends of the rod-like LED LD may be exposed.

As illustrated in FIG. 1, a portion of the insulation layer 14 is removed. However, side surfaces of the road-like LED LD may all be surrounded by the insulation layer 14.

The insulation layer 14 may be provided to surround at least a portion of the outer surface of the first conductive semiconductor layer 11, the active layer 12, and/or the second conductive semiconductor layer 13. For example, the insulation layer 14 may be provided to surround at least the outer surface of the active layer 12.

The insulation layer 14 may include a transparent insulating material. For example, the insulation layer 14 may include at least one insulating material selected from the group consisting of $SiO_2$, $Si_3N_4$, $Al_2O_3$ and $TiO_2$; however, the insulating layer 14 is not limited thereto, and various insulating materials may be used.

When the insulation layer 14 is provided on the rod-like LED LD, it is possible to prevent the active layer 12 from being short-circuited to the first and/or second electrode, or to substantially reduce the likelihood of such short-circuit. Also, surface defects of the rod-like LED LD may be reduced or minimized by the insulation layer 14, and lifetime and efficiency of the rod-like LED LD may be improved (e.g., increased). When a plurality of rod-like LEDs LD are disposed adjacent to each other, the insulation layer 14 may prevent unwanted shorts that may occur between the rod-like LEDs LD, or may substantially reduce the likelihood of such shorts.

The rod-like LED LD may be used as a light emitting source for various display devices. For example, the rod-like LED LD may be used as a light emitting source of a lighting device or a self-emission display device.

Figure 2:
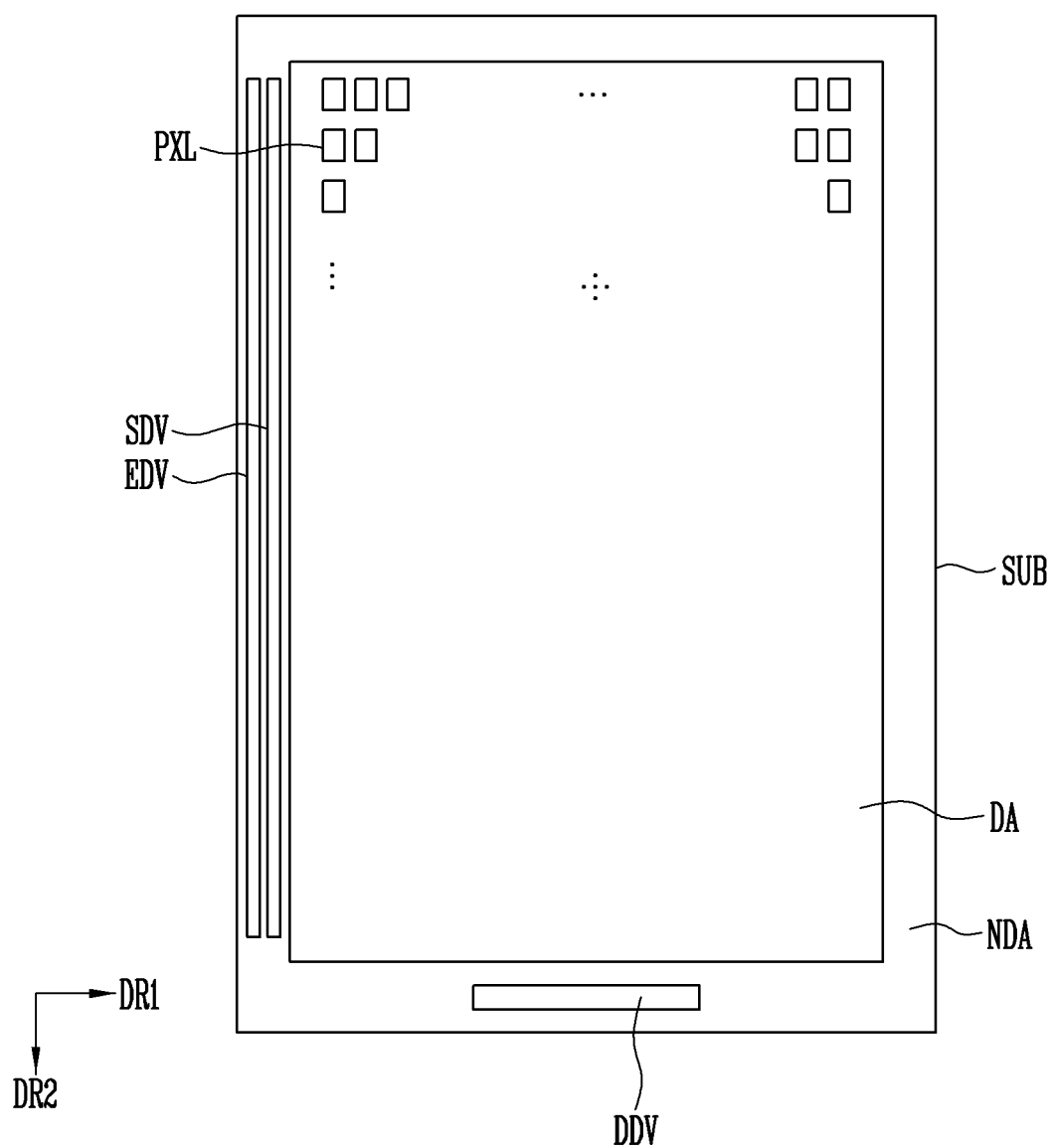
FIG. 2 is a schematic plan view of a display device using the rod-like light emitting diode shown in FIG. 1 as a light emitting source, according to an exemplary embodiment of the present invention.

FIG. 2 is a schematic plan view of a display device using the rod-like LED LD shown in FIG. 1 as a light emitting source, according to an exemplary embodiment of the present invention.

Referring to FIGS. 1 and 2, a display device according to an exemplary embodiment of the present invention may include a substrate SUB, a plurality of pixels PXL provided on the substrate SUB, a driving unit (e.g., driver) provided on the substrate SUB for driving the plurality of pixels PXL, and a line portion for connecting the plurality of pixels PXL to the driving unit.

The substrate SUB may include a display region DA and a non-display region NDA. The display region DA may be a region where the plurality of pixels PXL for displaying an image are provided. The non-display region NDA may be a region where the driving unit for driving the plurality of pixels PXL and a portion of the line portion for connecting the plurality of pixels PXL and the driving unit are provided, and where the pixels PXL may not be provided.

The plurality of pixels PXL may be provided in the display region DA of the substrate SUB. Each of pixels PXL, as a minimum unit for displaying an image, may include a light emitting element that emits white light and/or color light. Each pixel PXL may emit any one of red, green, and blue color lights; however, emitted light colors are not limited thereto. For example, each pixel PXL may emit one of cyan, magenta, yellow, and white colors.

The plurality of pixels PXL may be arranged in a matrix form along rows extending in a first direction DR1 and columns extending in a second direction DR2 intersecting the first direction DR1. However, the arrangement form of the pixels PXL is not particularly limited, and the pixels may be arranged in various suitable forms.

The driving unit may supply signals to each pixel PXL through the line portion, whereby the operation of the pixel PXL may be controlled. In FIG. 1, the line portion is omitted for convenience of explanation.

The driving unit may include a scan driver SDV for providing scan signals to the pixels PXL through scan lines, a light emitting driver EDV for providing light emission control signals to the pixels PXL through light emission control lines, a data driver DDV for providing data signals to the pixels PXL through data lines, and a timing controller. The timing controller may control the scan driver SDV, the light emitting driver EDV, and the data driver DDV.

Figure 3:
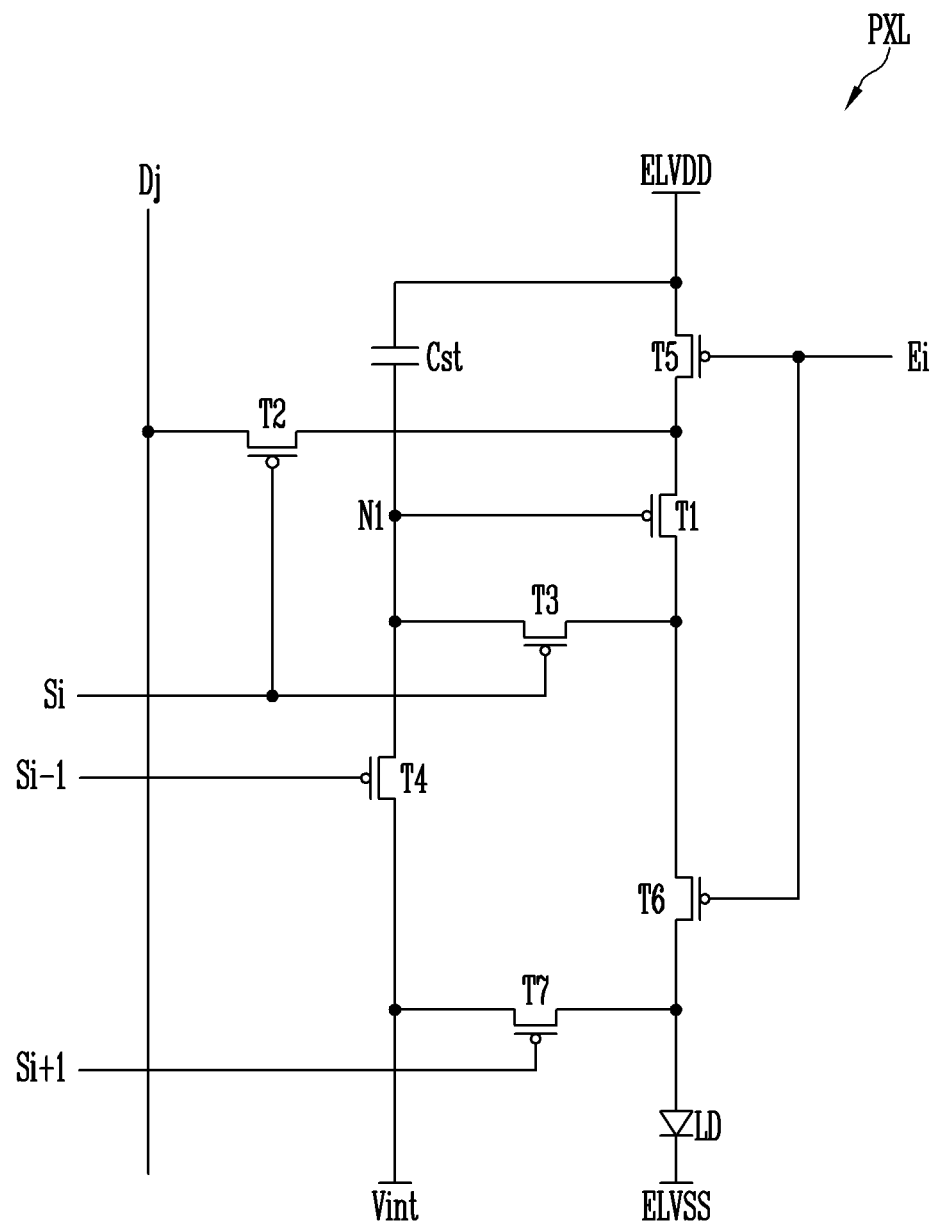
FIG. 3 is an equivalent circuit diagram illustrating one of the pixels shown in FIG. 2.

FIG. 3 is an equivalent circuit diagram illustrating one of the pixels shown in FIG. 2. For convenience of explanation, one pixel connected to a jth data line Dj, an i−1th scan line Si−1, an ith scan line Si, and an (i+1)th scan line Si−1 is shown in FIG. 3.

Referring to FIGS. 2 and 3, the pixel PXL according to an embodiment of the present invention may include a rod-like LED LD, first through seventh transistors T1 through T7, and a storage capacitor Cst.

One end of the rod-like LED LD may be connected to the first transistor T1 via the sixth transistor T6 and the other end of the rod-like LED LD may be connected to a second voltage source ELVSS. The rod-like LED LD may generate light having a set or predetermined brightness corresponding to the amount of current supplied from the first transistor T1.

A source electrode of the first transistor T1 (e.g., a driving transistor) may be connected to a first voltage source ELVDD via the fifth transistor T5 and a drain electrode of the first transistor T1 may be connected to one end of the rod-like LED LD via the sixth transistor T6.

The first transistor T1 controls the amount of current flowing from the first voltage source ELVDD to the second voltage source ELVSS via the rod-like LED LD in response to a voltage of a first node N1 which is a gate electrode of the first transistor T1.

The second transistor T2 (e.g., a switching transistor) may be connected between the jth data line Dj and the source electrode of the first transistor T1. In addition, a gate electrode of the second transistor T2 may be connected to the ith scan line Si.

When a scan signal is supplied to the ith scan line Si, the second transistor T2 is turned on and the jth data line Dj and the source electrode of the first transistor T1 are electrically connected.

The third transistor T3 may be connected between the drain electrode of the first transistor T1 and the first node N1. In addition, a gate electrode of the third transistor T3 may be connected to the ith scan line Si.

When a scan signal is supplied to the ith scan line Si, the third transistor T3 is turned on and the drain electrode of the first transistor T1 and the first node N1 are electrically connected. Accordingly, when the third transistor T3 is turned on, the first transistor T1 is connected in a diode form (e.g., the first transistor T1 is diode-connected or effectively acts as a diode).

The fourth transistor T4 may be connected between the first node N1 and an initial voltage source Vint. In addition, a gate electrode of the fourth transistor T4 may be connected to the i−1th scan line Si−1.

When a scan signal is supplied to the i−1th scan line Si−1, the fourth transistor T4 is turned on and a voltage of the initial voltage source Vint is supplied to the first node N1. Here, the voltage of the initial voltage source Vint is set to a lower voltage than the data signal.

The fifth transistor T5 may be connected between the first voltage source ELVDD and the source electrode of the first transistor T1. In addition, a gate electrode of the fifth transistor T5 may be connected to an ith light emission control line Ei.

When a light emission control signal is supplied to the ith light emission control line Ei, the fifth transistor T5 is turned off. The fifth transistor T5 is turned on in other cases.

The sixth transistor T6 may be connected between the drain electrode of the first transistor T1 and the one end of the rod-like LED LD. In addition, a gate electrode of the sixth transistor T6 may be connected to the ith light emission control line Ei.

When the light emission control signal is supplied to the ith light emission control line Ei, the sixth transistor T6 is turned off. The sixth transistor T6 is turned on in other cases.

The seventh transistor T7 may be connected between the initial voltage source Vint and one end of the rod-like LED LD. In addition, a gate electrode of the seventh transistor T7 may be connected to the (i+1)th scan line Si+1.

When the scan signal is supplied to the (H−1)th scan line Si+1, the seventh transistor T7 is turned on and the voltage of the initial voltage source Vint is supplied to the one end of the rod-like LED LD.

The storage capacitor Cst may be connected between the first voltage source ELVDD and the first node N1. The storage capacitor Cst may store a voltage corresponding to the data signal and a threshold voltage of the first transistor T1.

Figure 4:
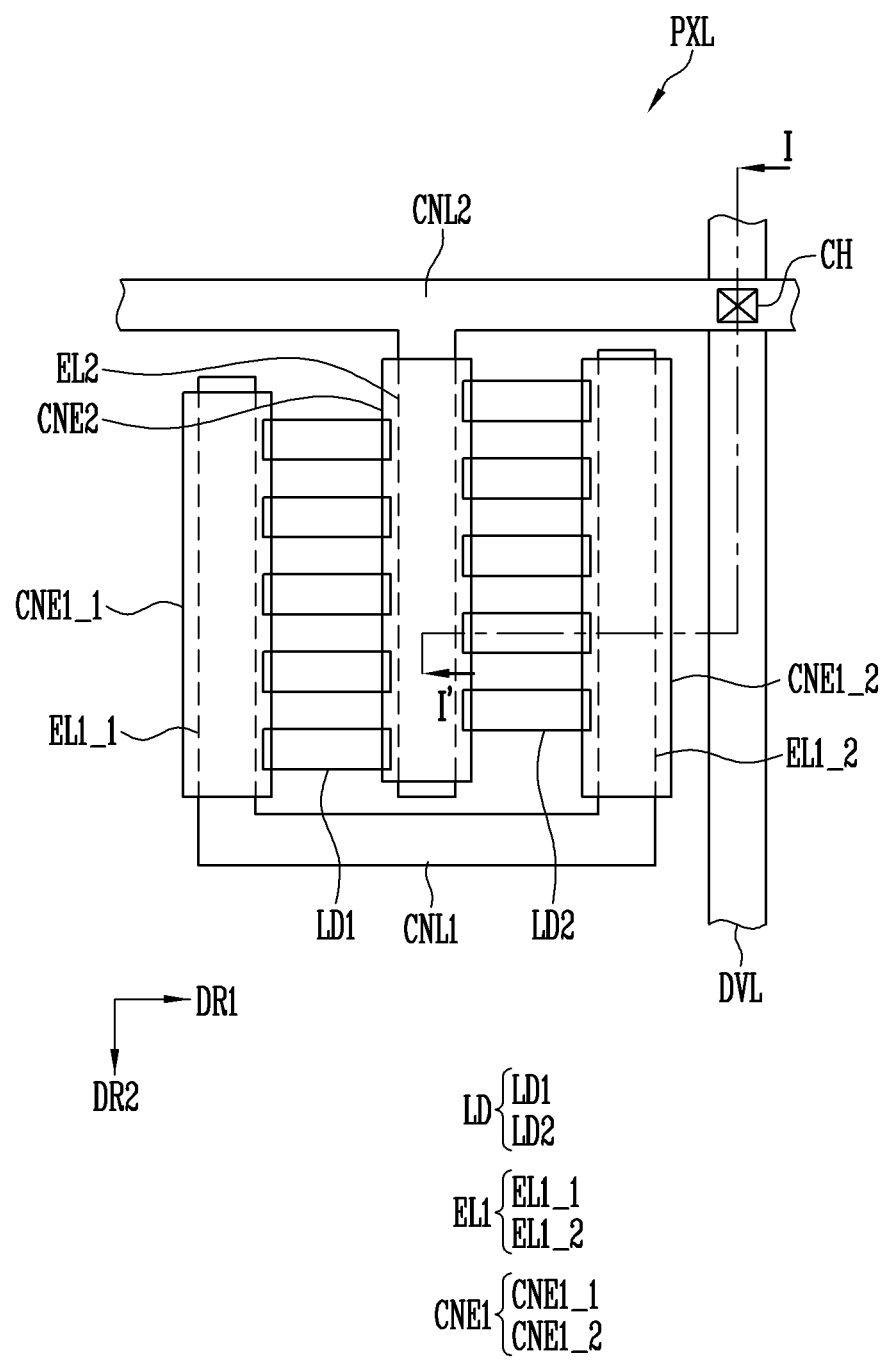
FIG. 4 is a plan view schematically showing a unit light emitting portion of one pixel including a plurality of rod-like LEDs, according to an exemplary embodiment of the present invention.
Figure 5:
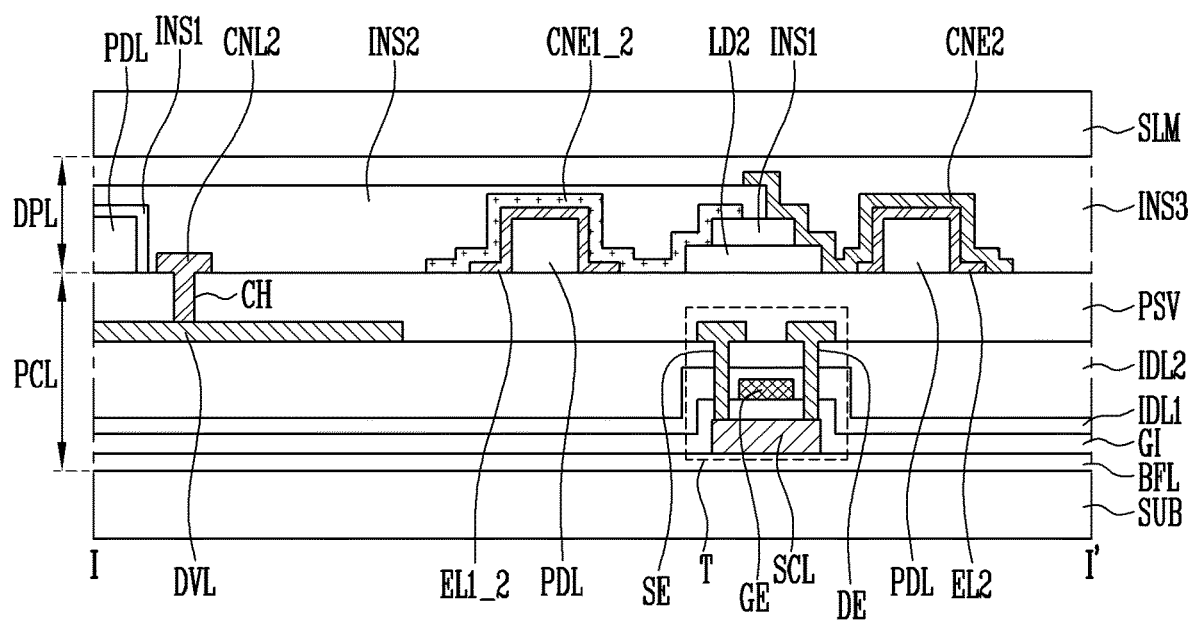
FIG. 5 is a cross-sectional view taken along line I-I' of FIG. 4.
Figure 6:
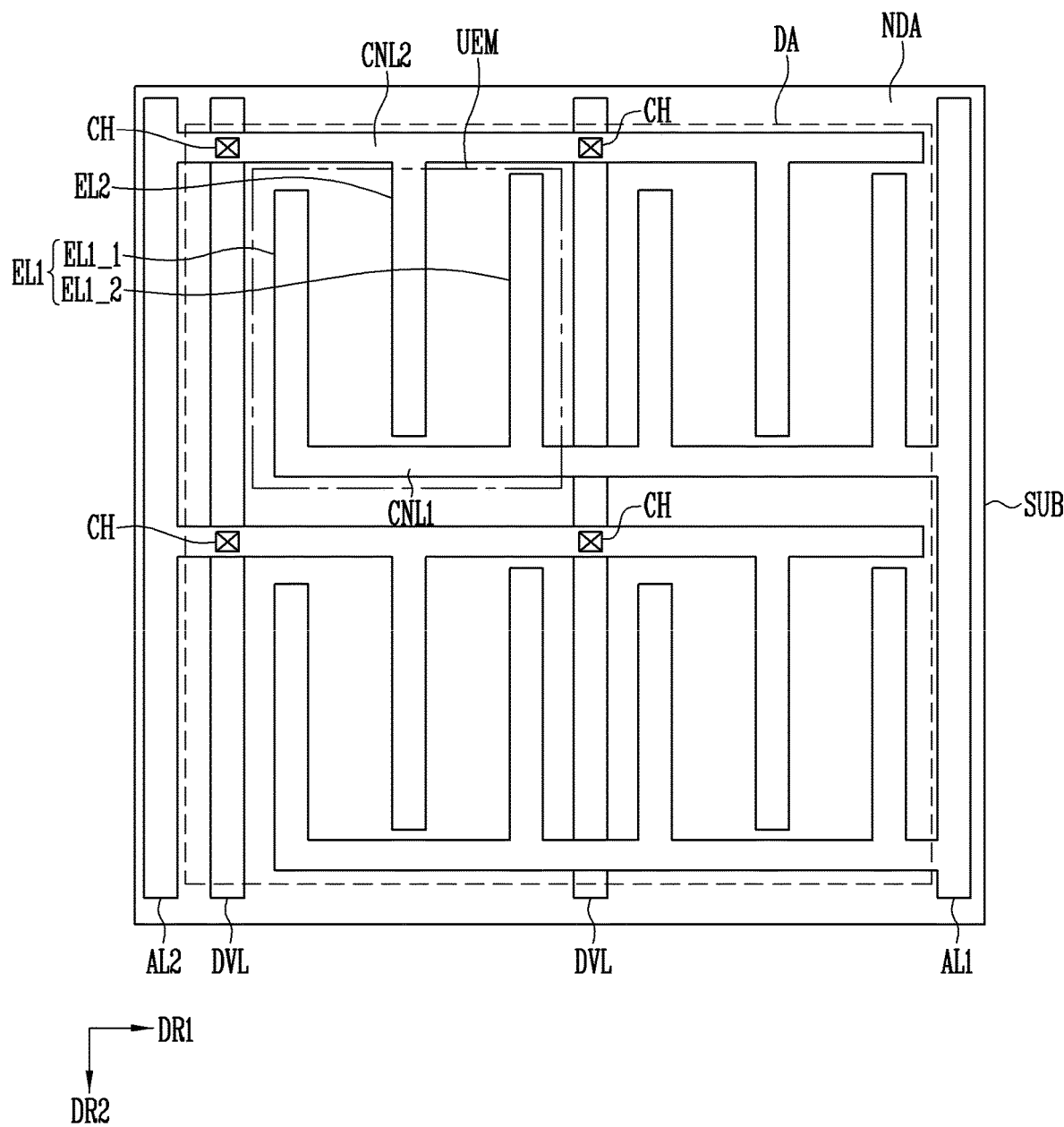
FIGS. 6-10 are plane views illustrating a method of manufacturing a light emitting element of the display device shown in FIG. 2.
Figure 7:
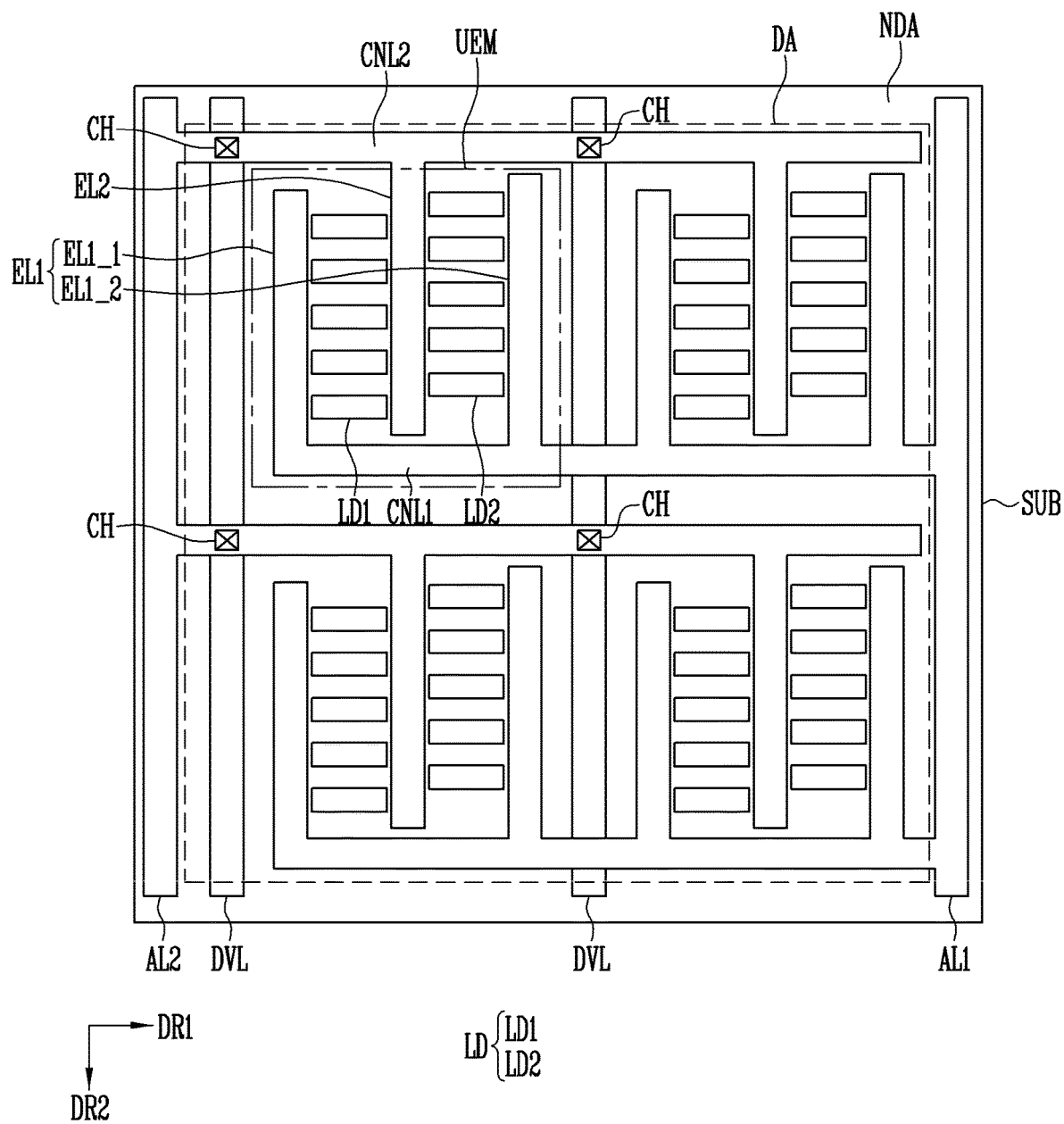
Figure 8:
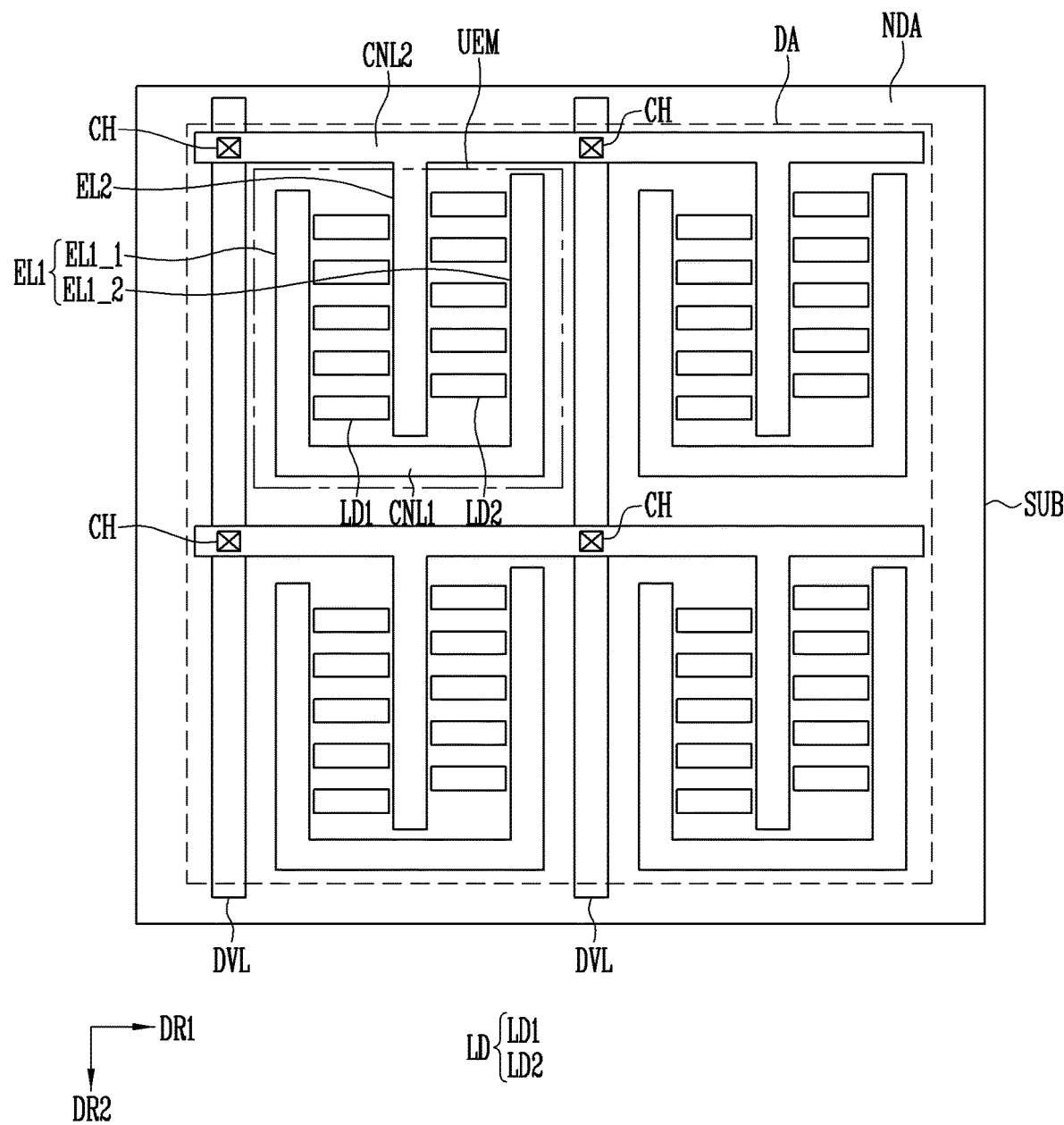
Figure 9:
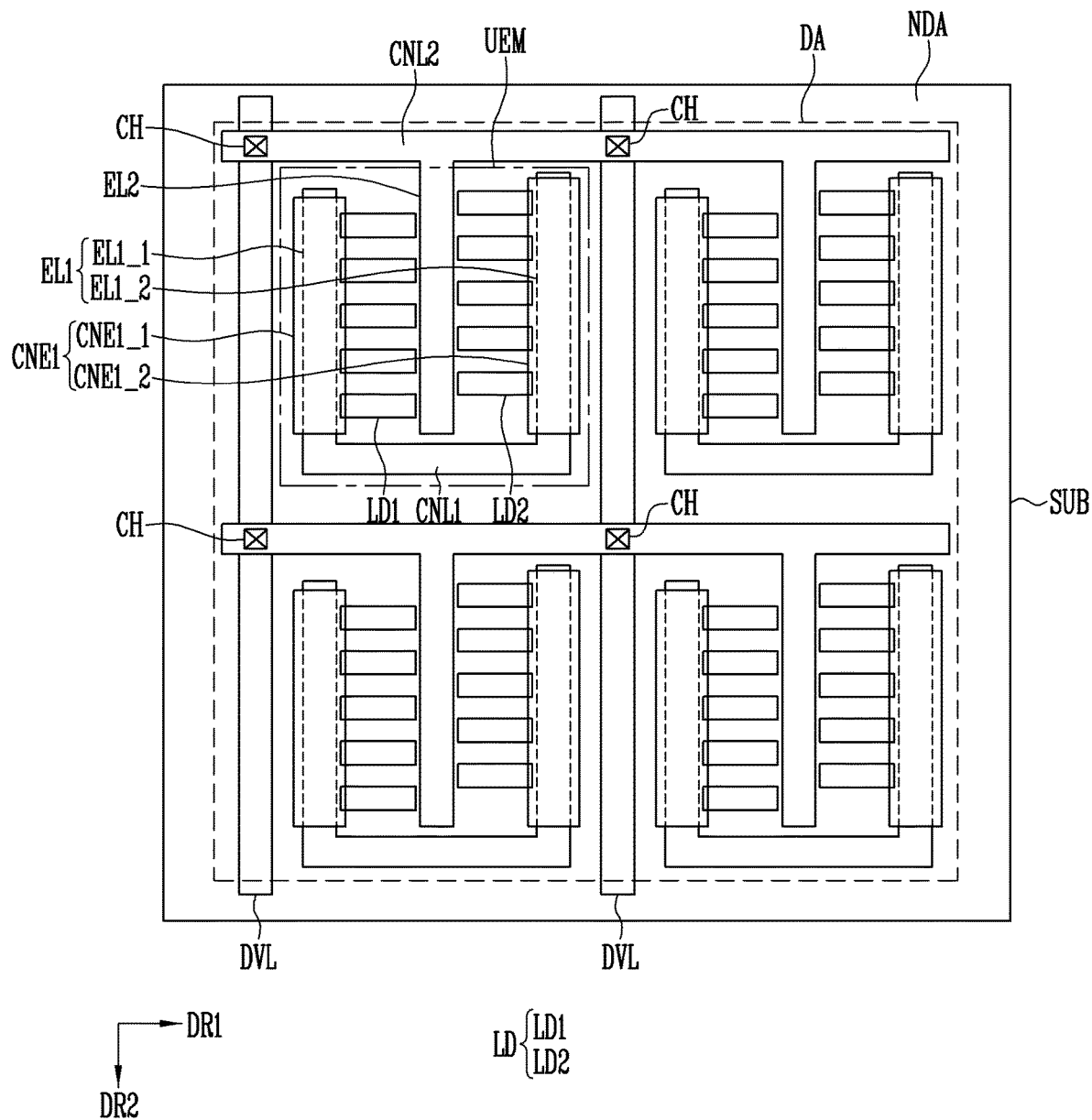
Figure 10:
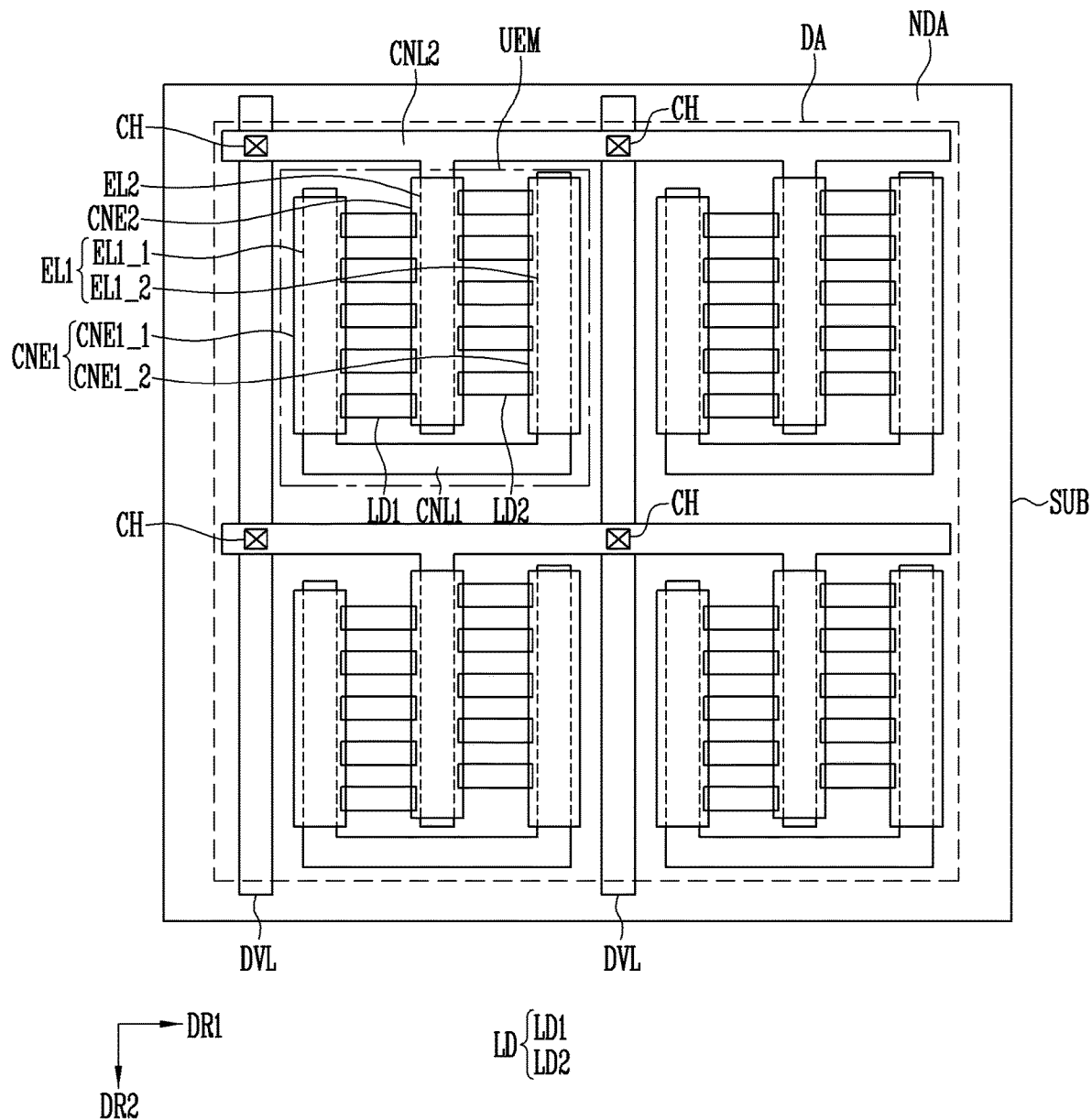

FIG. 4 is a plan view schematically showing a unit light emitting portion of one pixel including a plurality of rod-like LEDs. FIG. 5 is a cross-sectional view taken along line I-I' of FIG. 4.

For convenience of illustration, although FIG. 4 shows a plurality of rod-like LEDs aligned in the horizontal direction, the arrangement of the rod-like LEDs is not limited thereto. For example, the rod-like LEDs may be aligned in an oblique direction between the first electrode and the second electrode. In addition, in FIG. 4, the unit light emitting portion may be a pixel region including one pixel PXL.

Referring to FIGS. 1, 2, 4 and 5, the display device according to an exemplary embodiment of the present invention may include at least one or more pixels PXL. Each pixel PXL may include a substrate SUB, a pixel circuit unit (e.g., a pixel circuit) PCL, a display element layer DPL, and an encapsulation layer SLM.

The substrate SUB may include an insulating material such as glass, organic polymer, quartz, or the like. The substrate SUB may be made of a material having flexibility so as to be bent or folded, and may have a single-layer structure or a multilayer structure.

The pixel circuit unit PCL may include a buffer layer BFL disposed on the substrate SUB, a transistor T disposed on the buffer layer BFL, and a driving voltage line DVL.

The buffer layer BFL may prevent impurities from diffusing into the transistor T, or may substantially reduce the likelihood of such diffusion. The buffer layer BFL may be provided as a single layer, but may also be provided as at least two or more layers. When the buffer layer BFL is provided in multiple layers, each layer may be formed of the same material or different materials. The buffer layer BFL may be omitted depending on the material of the substrate SUB and the process conditions.

The transistor T may be electrically connected to a part of the plurality of rod-like LEDs LD included in the display element layer DPL to drive the rod-like LEDs LD. The transistor T may include a semiconductor layer SCL, a gate electrode GE, a source electrode SE, and a drain electrode DE.

The semiconductor layer SCL may be disposed on the buffer layer BFL. The semiconductor layer SCL may include a source region in contact with the source electrode SE and a drain region in contact with the drain electrode DE. The region between the source region and the drain region may be a channel region. The semiconductor layer SCL may be a semiconductor pattern made of poly silicon, amorphous silicon, oxide semiconductor, and/or the like. The channel region is a semiconductor pattern which is not doped with an impurity, and may be an intrinsic semiconductor. The source region and the drain region may be a semiconductor pattern doped with the impurity.

The gate electrode GE may be disposed on the semiconductor layer SCL with a gate insulating layer GI sandwiched therebetween.

Each of the source electrode SE and the drain electrode DE is electrically connected to the source region and the drain region of the semiconductor layer SCL through a contact hole passing through the first and second interlayer insulating layers ILD1 and ILD2 and the gate insulating layer GI.

A passivation layer PSV may be provided on the transistor T.

The driving voltage line DVL may be disposed on the second interlayer insulating layer ILD2 and may extend along the second direction DR2 when viewed in a plan view. The driving voltage line DVL may be electrically connected to a second connection line CNL2 included in the display element layer DPL through a contact hole CH passing through the passivation layer PSV. Therefore, a voltage applied to the driving voltage line DVL may be provided to the second connection line CNL2.

The display element layer DPL may include the rod-like LEDs LD disposed on the passivation layer PSV.

Each of the rod-like LEDs LD may include a first conductive semiconductor layer 11, a second conductive semiconductor layer 13 and an active layer 12 interposed between the first and second conductive semiconductor layers 11 and 13.

Also, the display element layer DPL may include a pixel defining layer PDL, first and second electrodes EL1 and EL2, first and second contact electrodes CNE1 and CNE2, a first connection line CNL1 and a second connection line CNL2.

The pixel defining layer PDL may be disposed on the passivation layer PSV and may define a light emitting region in the pixel PXL. The pixel defining layer PDL may include an opening corresponding to each rod-like LED LD. The pixel defining layer PDL disposed adjacent to both ends of each rod-like LED LD may serve as a barrier for improving a light emitting profile of each rod-like LED LD.

In an exemplary embodiment of the present invention, a first insulation layer INS1 may be disposed on each rod-like LED LD. The first insulation layer INS1 may cover a part of the top surface of each rod-like LED LD and may cover a part of the pixel defining layer PDL. Both ends of each rod-like LED LD may be exposed to the outside by the first insulation layer INS1.

The first electrode EL1 and the second electrode EL2 may be disposed on the pixel defining layer PDL serving as a partition wall. When viewed in a plan view, the first electrode EL1 and the second electrode EL2 may be spaced apart from each other with the corresponding rod-like LED LD interposed therebetween on the substrate SUB.

The first electrode EL1 may be disposed adjacent one end of the corresponding rod-like LED LD and may be connected to one end of the corresponding rod-like LED LD through the first contact electrode CNE1. The first electrode EL1 may be electrically connected to any one of the source electrode SE and the drain electrode DE of the transistor T. Therefore, a voltage supplied to the one electrode can be applied to the first electrode EL1.

The second electrode EL2 may be disposed adjacent the other end of the corresponding rod-like LED LD and may be connected to the other end of the corresponding rod-like LED LD through the second contact electrode CNE2.

The first electrode EL1 may include a (1-1)th electrode EL1_1 arranged on the left side of the second electrode EL2 and a (1-2)th electrode EL1_2 arranged on the right side of the second electrode EL2. In the pixel PXL, the first electrode EL1 and the second electrode EL2 may be provided in various suitable numbers and shapes.

In an exemplary embodiment of the present invention, the rod-like LEDs LD may include a first rod-like LED LD1 and a second rod-like LED LD2. When viewed in a plan view, the first rod-like LED LD1 may be disposed between the (1-1)th electrode EL1_1 and the second electrode EL2 and the second rod-like LED LD2 may be disposed between the second electrode EL2 and the (1-2)th electrode EL1_2.

The first contact electrode CNE1 for electrically and/or physically connecting the first electrode EL1 to one end of the corresponding rod-like LED LD may be provided on the first electrode EU.

The first contact electrode CNE1 may be in ohmic contact (e.g., in physical contact) with the first electrode EL1.

When viewed in a plan view, the first contact electrode CNE1 may include a (1-1)th contact electrode CNE1_1 overlapping the (1-1)th electrode EL1_1 and a (1-2)th contact electrode CNE1_2 overlapping the (1-2)th electrode EL1_2. The (1-1)th contact electrode CNE1_1 may be in ohmic contact (e.g., in physical contact) with the (1-1)th electrode EL1_1 and the (1-2)th contact electrode CNE1_2 may be in ohmic contact (e.g., in physical contact) with the (1-2)th electrode EL1_2.

A second insulation layer INS2 may be disposed on the substrate SUB including the first contact electrode CNE1. The second insulation layer INS2 may be an inorganic insulation layer including inorganic material or an organic insulation layer including organic material.

The second contact electrode CNE2 for electrically and/or physically connecting the second electrode EL2 to the other end of the corresponding rod-like LED LD may be provided on the second electrode EL2.

The second contact electrode CNE2 may be in ohmic contact (e.g., in physical contact) with the second electrode EL2. When viewed in a plan view, the second contact electrode CNE2 may overlap the second electrode EL2.

The first connection line CNL1 may electrically and physically connect the (1-1)th electrode EL1_1 and (1-2)th electrode EL1_2 arranged adjacently in the pixel PXL.

The first connection line CNL1 may be provided integrally (or integrated) with the (1-1)th electrode EL1_1 and the (1-2)th electrode EL1_2 on the substrate SUB. When viewed in a plan view, the first connection line CNL1 may be extended along a first direction DR1 and may be provided between the (1-1)th electrode EL1_1 and the (1-2)th electrode EL1_2.

The second connection line CNL2 may be electrically and physically connected to the second electrode EL2. The second connection line CNL2 may be provided integrally (or integrated) with the second electrode EL2 on the substrate SUB.

When viewed in a plan view, the second connection line CNL2 may be extended along the first direction DR1. The second connection line CNL2 may be a medium for electrically connecting the second electrode EL2 and the driving voltage line DVL.

The second connection line CNL2 may be electrically connected to the driving voltage line DVL through the contact hole CH. Therefore, a driving voltage of the driving voltage line DVL may be finally applied to the second electrode EL2 through the second connection line CNL2. In an embodiment of the present invention, the driving voltage of the driving voltage line DVL may be a second voltage source (see ELVSS in FIG. 3).

As described above, one end of each rod-like LED LD may contact the first electrode EL1 and the other end of each rod-like LED LD may contact the second electrode EL2. For example, the first conductive semiconductor layer 11 of each rod-like LED LD may contact the first electrode EL1 and the second conductive semiconductor layer 13 of each rod-like LED LD may contact the second electrode EL2. Accordingly, the first and second conductive semiconductor layers 11 and 13 of each rod-like LED LD may receive a set or predetermined voltage through the first electrode EL1 and the second electrode EL2. When a voltage exceeding a set or predetermined voltage is applied to both ends of each rod-like LED LD, each rod-like LED LD emits light while the electron-hole pairs are coupled in the active layer 12.

A third insulation layer INS3 may be disposed on the substrate SUB including the second contact electrode CNE2. The third insulation layer INS3 may cover the second contact electrode CNE2 disposed under the third insulating layer INS3 so as not to be exposed to the outside. In addition, the third insulation layer INS3 may serve to flatten the surface roughened by the components disposed below the third insulation layer INS3.

The encapsulation layer SLM may be disposed on the third insulation layer INS3. The encapsulation layer SLM covers the display element layer DPL provided on the substrate SUB and may prevent oxygen and moisture from penetrating into the display element layer DPL, or may substantially reduce the likelihood of such penetration. The encapsulation layer SLM may be formed of a single layer, or may be formed of multiple layers.

The encapsulation layer SLM may include a plurality of insulation layers covering the display element layer DPL. For example, the encapsulation layer SLM may include a plurality of inorganic layers and a plurality of organic layers. For example, the encapsulation layer SLM may have a structure in which the inorganic layer and the organic layer are alternately stacked.

FIGS. 6 to 10 are plane views illustrating a method of manufacturing a light emitting element of the display device shown in FIG. 2.

In FIGS. 6 to 10, the pixel circuit unit and signal lines connected to the pixel circuit unit are not shown for convenience of explanation.

Also, in FIGS. 7 to 10, for convenience of illustration, a plurality of rod-like LEDs are shown as aligned in the horizontal direction; however, the arrangement of the plurality of rod-like LEDs is not limited thereto.

Referring to FIGS. 1 to 6, the first electrode EL1, the second electrode EL2, the first connection line CNL1, the second connection line CNL2, a first alignment line AU and a second alignment line AL2 are formed on the substrate SUB provided with the driving voltage line DVL.

The substrate SUB may include the display region DA and the non-display region NDA. In an embodiment of the present invention, the first electrode EL1, the second electrode EL2, the first connection line CNL1 and the second connection line CNL2 may be provided in the display region DA of the substrate SUB. The first and second alignment lines AL1 and AL2 may be provided in the non-display region NDA of the substrate SUB.

The first and second electrodes EL1 and EL2, the first and second connection lines CNL1 and CNL2 and the first and second alignment lines AL1 and AL2 may be provided on the same plane of the substrate SUB. That is, the first and second electrodes EU and EL2, the first and second connection lines CNL1 and CNL2 and the first and second alignment lines AL1 and AL2 may be provided at the same layer.

The first and second electrodes EL1 and EL2, the first and second connection lines CNL1 and CNL2 and the first and second alignment lines AL1 and AL2 may include the same material. For example, the first and second electrodes EU and EL2, the first and second connection lines CNL1 and CNL2 and the first and second alignment lines AL1 and AL2 may include a conductive material.

The conductive material may include a metal such as Ag, Mg, Al, Pt, Pd, Au, Ni, Nd, Ir, Cr, an alloy thereof, and/or the like, a conductive oxide such as ITO (indium tin oxide), IZO (indium zinc oxide), ZnO (zinc oxide) or ITZO (indium tin zinc oxide), a conductive polymer such as PEDOT, and/or the like.

Each of the first and second electrodes EL1 and EL2, the first and second connection lines CNL1 and CNL2 and the first and second alignment lines AL1 and AL2 may be formed of, but is not limited to, a single layer. Each of them may be formed of a multilayer in which two or more materials of metals, alloys, conductive oxides, and conductive polymers are stacked.

The first electrode EU, the first connection line CNL1 and the first alignment line AL1 may be integrally provided (or be integrated) and electrically and physically connected to each other. Also, the second electrode EL2, the second connection line CNL2 and the second alignment line AL2 may be integrally provided (or be integrated) and electrically and physically connected to each other.

When viewed in a plan view, the first connection line CNL1 and the second connection line CNL2 may extend along the first direction DR1 of the substrate SUB.

The first alignment line AL1 and the second alignment line AL2 may extend along a second direction DR2 of the substrate SUB intersecting the first direction DR1.

The first electrode EL1 connected to the first connection line CNL1 may include the (1-1)th electrode EL1_1 and the (1-2)th electrode EL1_2 branched to (e.g., extending out at) the left and right sides of the second electrode EL2 when viewed in a plan view. Therefore, the (1-1)th and (1-2)th electrodes EL1_1 and EL1_2 and the second electrode EL2 may be alternately arranged on the substrate SUB. In particular, the second electrode EL2 may be disposed between the (1-1)th electrode EL1_1 and the (1-2)th electrode EL1_2 when viewed in a plan view.

In an embodiment of the present invention, the (1-1)th electrode EL1_1, the (1-2)th electrode EL1_2 and the second electrode EL2 provided between the (1-1)th electrode EL1_1 and the (1-2)th electrode EL1_2 may constitute a unit light emitting portion UEM on the substrate SUB. Each of the plurality of pixels PXL provided in the display region DA of the substrate SUB may include the unit light emitting portion UEM. That is, in an embodiment of the present invention, each pixel PXL may include the unit light emitting portion UEM.

In an embodiment of the present invention, the first electrode EL1 including the (1-1)th electrode EL1_1 and the (1-2)th electrode EL1_2 may be an anode electrode and the second electrode EL2 may be a cathode electrode. The first electrode EL1 which is the anode electrode is electrically and physically connected to the first alignment line AL1 and the second electrode EL2 which is the cathode electrode is electrically and physically connected to the second alignment line AL2.

Therefore, in an embodiment of the present invention, the first electrode. EL1 included in the unit light emitting portion UEM of each pixel PXL is electrically and physically connected to the first electrode EL1 included in the unit light emitting portion UEM of the adjacent pixel PXL through the first connection line CNL1 and the first alignment line AL1. Also, the second electrode EL2 included in the unit light emitting portion UEM of each pixel PXL is electrically and physically connected to the second electrode EL2 included in the unit light emitting portion UEM of the adjacent pixel PXL through the second connection line CNL2 and the second alignment line AL2.

In one embodiment of the present invention, voltage sources having different voltage levels may be applied to the first alignment line AL1 and the second alignment line AL2. For example, a ground voltage GND may be applied to the first alignment line AL1, and a DC voltage or an AC voltage may be applied to the second alignment line AL2. Each of the first alignment line AL1 and the second alignment line AL2 is applied with a different set or predetermined voltage, so that an electric field may be formed between the first electrode EL1 and the second electrode EL2.

The electrical characteristics of the transistor T included in the pixel circuit unit PCL and connected to the first electrode EL1 are not affected because the ground voltage GND is applied to the first electrode EL1.

For example, because the first electrode EL1 is an anode electrode electrically connected to the pixel circuit unit PCL, when the AC or DC voltage having a set or predetermined voltage level except for the ground voltage GND is applied to the first electrode EU, the threshold voltage of the transistor T may be changed due to the influence of the voltage applied to the first electrode EL1.

As a result, the electrical characteristics of the transistor T are changed and the pixel circuit unit PCL may malfunction. In order to prevent the malfunction of the pixel circuit unit PCL, the ground voltage GND may be applied to the first electrode EL1 connected to the pixel circuit unit PCL and the voltage having a set or predetermined voltage level may be applied to the second electrode EL2.

Referring to FIGS. 1 to 7, a plurality of rod-like LEDs LD may be located (e.g., scattered) on the substrate SUB in a state that an electric field is applied between the first electrode EL1 and the second electrode EL2.

As a non-limiting example of a method of positioning (e.g., scattering) the rod-like LEDs LD on the substrate SUB on which the first and second electrodes EU and EL2 are formed, an ink-jet printing method may be used. However, the present invention is not limited thereto, and any suitable method may be utilized. For example, a nozzle may be disposed on the substrate SUB, and a solution containing the rod-like LEDs LD may be dropped on the substrate SUB through the nozzle. Thereby the rod-like LEDs LD may be located (e.g., scattered) in the display region DA of the substrate SUB. The method of dispensing the rod-like LEDs LD is not limited to the above stated methods and any suitable method may be utilized.

Because the electric field is formed between the first electrode EL1 and the second electrode EL2, self-alignment of the scattered rod-like LEDs LD may be induced. When each voltage is applied to the first and second electrodes EL1 and EL2, bipolarity of the rod-like LED LD is induced by the electric field formed between the first and second electrodes EL1 and EL2. Accordingly, the rod-like LEDs LD may be self-aligned between the first and second electrodes EL1 and EL2.

In the unit light emitting portion UEM, the rod-like LEDs LD may include the first rod-like LED LD1 aligned between the (1-1)th electrode EL1_1 and the second electrode EL2 and the second rod-like LED LD2 aligned between the second electrode EL2 and the (1-2)th electrode EL1_2.

As described above, according to an embodiment of the present invention, the rod-like LEDs LD may be easily aligned on the substrate SUB by applying different voltages to the first and second alignment lines AU and AL2.

The first insulation layer INS1 may be provided on the self-aligned rod-like LEDs LD to cover a portion of the top surface of each of the rod-like LEDs LD.

Referring to FIGS. 1 to 8, the first and second alignment lines AL1 and AL2 may be removed from the substrate SUB on which the rod-like LEDs LD are aligned. At the same time, a part of the first connection line CNL1 may be removed from the substrate SUB of the display region DA. As a method of removing the first and second alignment lines AL1 and AL2 and a part of the first connection line CNL1, an etching method may be used. However, the present invention is not limited thereto, and any suitable method may be utilized.

The part of the first connection line CNL1 removed by the etching method may be a crossed first connection line CNL1 between the unit light emitting portion UEM included in one pixel PXL and the unit light emitting portion UEM included in another one pixel PXL adjacent thereto. As the first connection line CNL1 across the adjacent two pixels PXL is removed, the adjacent two pixels PXL may be individually driven.

Referring to FIGS. 1 to 9, the first contact electrode CNE1 may be provided on the substrate SUB from which the first and second alignment lines AU and AL2 are removed.

When viewed in a plan view, the first contact electrode CNE1 may overlap the first electrode EL1. The first contact electrode CNE1 may include the (1-1)th contact electrode CNE1_1 formed on the (1-1)th electrode EL1_1 and the (1-2)th contact electrode CNE1_2 formed on the (1-2)th electrode EL1_2. The (1-1)th contact electrode CNE1_1 may be in ohmic contact (e.g., in physical contact) with the (1-1)th electrode EL1_1 and the (1-2)th contact electrode CNE1_2 may be in ohmic contact (e.g., in physical contact) with the (1-2)th electrode EL1_2.

The (1-1)th contact electrode CNE1_1 may electrically and physically connect the one end of the first rod-like LED LD1 and the (1-1)th electrode EL1_1. In addition, the (1-2)th contact electrode CNE1_2 may electrically and physically connect the other end of the second rod-like LED LD2 and the (1-2)th electrode EL1_2. The (1-1)th and (1-2)th contact electrodes CNE1_1 and CNE1_2 may be composed of a transparent conductive material, so that light emitted from the first and second rod-like LEDs LD1 and LD2 may be transmitted; however, the present invention is not limited thereto.

The second insulation layer INS2 may be provided on the substrate SUB on which the first contact electrode CNE1 is formed.

Referring to FIGS. 1 to 10, the second contact electrode CNE2 may be provided on the substrate SUB on which the first contact electrode CNE1 and the second insulation layer INS2 are formed.

The second contact electrode CNE2 may be provided on the second electrode EL2 to cover the second electrode EL2. The second contact electrode CNE2 may be in ohmic contact (e.g., in physical contact) with the second electrode EL2. The second contact electrode CNE2 may be composed of the same material as the first contact electrode CNE1; however, the present invention is not limited thereto.

The second contact electrode CNE2 may overlap the second electrode EL2 when viewed in a plan view. In addition, the second contact electrode CNE2 may overlap the other end of the first rod-like LED LD1 and one end of the second rod-like LED LD2 when viewed in a plan view.

The second contact electrode CNE2 may electrically and/or physically connect one side of the second electrode EL2 and the other end of the first rod-like LED LD1. Also, the second contact electrode CNE2 may electrically and/or physically connect the other side of the second electrode EL2 and one end of the second rod-like LED LD2.

According to an embodiment of the present invention, it is possible to provide a method of manufacturing a display device in which the light emitting elements are easily aligned on the substrate and the influence on the pixel circuit unit during alignment of the light emitting elements may be reduced or minimized.

The display device according to an embodiment of the present invention may be employed in various suitable electronic devices. For example, the display device may be applied to a television, a notebook, a mobile phone, a smart phone, a smart pad (PD), a PMP, a PDA, a navigation device, various wearable devices such as a smart watch, and/or the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

Furthermore, when a first part such as a layer, a film, a region, or a plate is disposed on a second part, the first part may be not only directly on the second part but a third part may intervene between them. In addition, when it is expressed that a first part, such as a layer, a film, a region, or a plate, is formed on a second part, the surface of the second part on which the first part is formed is not limited to an upper surface of the second part but may include other surfaces such as a side surface or a lower surface of the second part. To the contrary, when a first part, such as a layer, a film, a region, or a plate, is under a second part, the first part may be not only directly under the second part but a third part may intervene between them.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

As described above, the exemplary embodiments of the present invention have been disclosed through the detailed description and the drawings. It is to be understood that the terminology used herein is for the purpose of describing the present invention and is not used to limit the scope of the present invention. Therefore, those skilled in the art will appreciate that various modifications and equivalent embodiments are possible without departing from the scope of the present invention. Accordingly, the true scope of the present invention should be determined by the appended claims and equivalents thereof.

What is claimed is:

1. A method of manufacturing a display device, the method comprising:
    providing a substrate;
    forming a first electrode, forming a second electrode spaced from the first electrode and in a same plane as the first electrode, forming a first alignment line connected to the first electrode and comprising a same material as the first electrode, and forming a second alignment line connected to the second electrode and comprising a same material as the second electrode on the substrate;
    self-aligning a plurality of light emitting elements by providing a solution containing the plurality of light emitting elements on the substrate having thereon the first and second electrodes and the first and second alignment lines, and supplying voltages to the first alignment line and the second alignment line;
    removing the first alignment line and the second alignment line from the substrate on which the plurality of light emitting elements are self-aligned;
    forming a first contact electrode electrically connecting one end of each light emitting element of the plurality of light emitting elements to the first electrode; and
    forming a second contact electrode electrically connecting an other end of each light emitting element to the second electrode.

2. The method of claim 1, wherein the removing of the first alignment line and the second alignment line is by an etching method.

3. The method of claim 2, wherein the substrate comprises a display region on which a plurality of pixels are located and a non-display region on at least one side of the display region, and
    wherein the first electrode and the second electrode are at the display region and the first alignment line and the second alignment line are at the non-display region.

4. The method of claim 3, wherein a first connection line connecting the first alignment line and the first electrode and a second connection line connecting the second alignment line and the second electrode are at the display region of the substrate.

5. The method of claim 4, wherein the first connection line is integrated with the first electrode, and the second connection line is integrated with the second electrode.

6. The method of claim 5, wherein the removing of the first alignment line and the second alignment line comprises removing a part of the first connection line between adjacent two pixels.

7. The method of claim 5, wherein each of the light emitting elements comprises:
   a first conductive semiconductor layer doped with a first conductive dopant,
   a second conductive semiconductor layer doped with a second conductive dopant; and
   an active layer between the first conductive semiconductor layer and the second conductive semiconductor layer.

8. The method of claim 7, wherein the first electrode comprises an anode electrode, and the second electrode comprises a cathode electrode.

9. The method of claim 8, wherein in the self-aligning of the light emitting elements, a voltage supplied to the first alignment line and a voltage supplied to the second alignment line are different.

10. The method of claim 9, wherein the voltage supplied to the first alignment line is a ground voltage.

11. The method of claim 1, wherein each of the light emitting elements comprises a light emitting diode in the form of a cylindrical or polygonal column having a micro scale or a nano scale.

12. The method of claim 11, wherein the providing of the substrate comprises:
   forming at least one transistor for driving the plurality of light emitting elements on the substrate; and
   forming a passivation layer on the transistor.

13. A method of manufacturing a display device, the method comprising:
   providing a substrate comprising a display region on which a plurality of pixels are provided and a non-display region on at least one side of the display region;
   forming at least one transistor on the substrate of the display region;
   forming a passivation layer on the substrate;
   forming first and second electrodes on the passivation layer corresponding to the display region, the second electrode being spaced from the first electrode and in a same plane as the first electrode;
   forming a first alignment line connected to the first electrode and comprising a same material as the first electrode, and forming a second alignment line connected to the second electrode and comprising a same material as the second electrode on the passivation layer corresponding to the non-display region;
   self-aligning a plurality of light emitting elements by providing a solution containing the plurality of light emitting elements on the substrate having thereon the first and second electrodes and the first and second alignment lines, and supplying voltages to the first alignment line and the second alignment line;
   removing the first alignment line and the second alignment line from the substrate on which the plurality of light emitting elements are self-aligned using an etching method;
   forming a first contact electrode electrically connecting one end of each light emitting element of the plurality of light emitting elements and the first electrode; and
   forming a second contact electrode electrically connecting an other end of each light emitting element and the second electrode.

14. The method of claim 13, wherein the first electrode comprises an anode electrode, and the second electrode comprises a cathode electrode.

15. The method of claim 14, wherein in the self-aligning of the light emitting elements, a voltage supplied to the first alignment line and a voltage supplied to the second alignment line are different.

16. The method of claim 15, wherein the voltage supplied to the first alignment line is a ground voltage.

17. The method of claim 13, further comprising:
   forming a first connection line electrically connecting the first alignment line to the first electrode, and forming a second connection line electrically connecting the second alignment line to the second electrode, on the display region of the substrate.

18. The method of claim 17, wherein the first connection line is integrated with the first electrode, and the second connection line is integrated with the second electrode.

19. The method of claim 18, wherein the removing of the first alignment line and the second alignment line comprises removing a part of the first connection line between adjacent two pixels.

* * * * *